(12) United States Patent
Toyoyama

(10) Patent No.: US 6,985,026 B2
(45) Date of Patent: Jan. 10, 2006

(54) SEMICONDUCTOR INTEGRATED CIRCUIT DEVICE AND CELLULAR TERMINAL USING THE SAME

(75) Inventor: Shinji Toyoyama, Sakurai (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/485,988

(22) PCT Filed: Aug. 2, 2002

(86) PCT No.: PCT/JP02/07888

§ 371 (c)(1),
(2), (4) Date: Feb. 5, 2004

(87) PCT Pub. No.: WO03/014856

PCT Pub. Date: Feb. 20, 2003

(65) Prior Publication Data

US 2004/0245572 A1    Dec. 9, 2004

(30) Foreign Application Priority Data

Aug. 6, 2001 (JP) .............................. 2001-238016

(51) Int. Cl.
     *G05F 1/10*      (2006.01)
(52) U.S. Cl. .................................... 327/540; 327/541
(58) Field of Classification Search ............... 327/538, 327/540, 541, 543; 323/315, 316
See application file for complete search history.

(56) References Cited

U.S. PATENT DOCUMENTS

| | | | |
|---|---|---|---|
| 4,683,382 A * | 7/1987 | Sakurai et al. .............. | 327/544 |
| 5,493,234 A * | 2/1996 | Oh .............................. | 326/33 |
| 5,773,968 A * | 6/1998 | Kondo et al. ................ | 327/544 |
| 5,812,021 A * | 9/1998 | Ikeda .......................... | 327/541 |
| 5,821,808 A * | 10/1998 | Fujima ....................... | 327/541 |
| 5,892,381 A * | 4/1999 | Koifman et al. ............ | 327/541 |
| 5,936,455 A * | 8/1999 | Kobayashi et al. ......... | 327/541 |
| 6,040,610 A | 3/2000 | Noguchi et al. | |
| 6,184,744 B1 * | 2/2001 | Morishita ................... | 327/541 |
| 6,313,694 B1 * | 11/2001 | Sohn .......................... | 327/541 |
| 6,661,279 B2 * | 12/2003 | Yabe .......................... | 327/541 |

FOREIGN PATENT DOCUMENTS

| | | |
|---|---|---|
| JP | 6-265584 A | 9/1994 |
| JP | 08-136621 A | 5/1996 |
| JP | 9-25125 A | 9/1997 |
| JP | 10-294383 A | 11/1998 |
| JP | 10-340998 A | 12/1998 |
| JP | 2001-67872 A | 3/2001 |

* cited by examiner

*Primary Examiner*—Terry D. Cunningham
(74) *Attorney, Agent, or Firm*—Birch, Stewart, Kolasch & Birch, LLP

(57) ABSTRACT

In a semiconductor integrated circuit device, a first control signal outputted from the power voltage evaluation circuit controls power voltage of the power voltage generation circuit so that the power voltage becomes lower within a range over which the internal circuit normally operates, while a second control signal outputted from the specified voltage detection circuit controls the power voltage of the power voltage generation circuit so that the power voltage generated by the power voltage generation circuit does not become equal to or higher than a specified voltage. This makes the power voltage as low as possible within the normally operational range of the internal circuit and suppresses increase of the gate current, so that unstable operations and current consumption increase of the MOS transistor can be prevented.

12 Claims, 5 Drawing Sheets

SEMICONDUCTOR INTEGRATED CIRCUIT DEVICE AND CELLULAR TERMINAL USING THE SAME

TECHNICAL FIELD

The present invention relates to a semiconductor integrated circuit device equipped with a power voltage generation circuit for a supplying power voltage to an internal circuit, and also to a portable terminal using the device.

BACKGROUND ART

Generally, for integrated circuits in which arithmetic processing or the like is performed in accordance with an operation clock, there is a need for providing large design margins in order to ensure normal operations at all times against variations in manufacturing processes or such variations as power supply variations and temperature changes. That is, in order that the processing time falls within one cycle time of the clock even if the circuit delay is increased by various types of changes or the like so that the processing time is increased, design margin are provided by constructing circuits in parallel fashion to suppress the processing time, or by applying a power voltage higher than that at which the integrated circuit operates normally so that the circuit delay is decreased, or by other means. These large design margins cause obstruction to downsizing or power consumption reduction of integrated circuits.

Thus, there has been proposed a technique for detecting the operating state of an integrated circuit and controlling the power voltage so as to allow a minimum power voltage required for the operation of the integrated circuit can be supplied. The concept of this technique is disclosed in Japanese unexamined patent application No. H08-136621. This technique is to implement an adjustment so that the power voltage becomes as small as possible within such a range that the processing time falls just within the one cycle time of the clock even if the processing time has changed due to variations in manufacturing processes or such variations as power supply variations and temperature changes. That is, if the processing time is increased toward excess over the one-cycle time of the clock, the power voltage is increased so as to suppress the processing time. If the processing time is decreased so that there is a margin for the cycle time of the clock, then the power voltage is lowered. As a result of this, even if the circuit delay is increased, causing the processing time to be increased, due to various types of variations, it is no longer necessary to suppress the arithmetic processing time by making up a parallel construction of circuits, or by applying a power voltage larger than the power voltage at which the integrated circuit normally operates.

The adjustment of the power voltage is implemented in the semiconductor integrated circuit device shown in FIG. 3 as follows.

The semiconductor integrated circuit device, as shown in FIG. 3, includes a power voltage generation circuit 31 for generating a power voltage, a power voltage evaluation circuit 32 for receiving a generated power voltage as an input and producing a control signal as an output, and an internal circuit 33 for receiving a generated power voltage as an input and performing specified processing.

The control signal outputted from the power voltage evaluation circuit 32 adjusts the power voltage so that the power voltage becomes as low as possible within a range over which the internal circuit 33 normally operates. More specifically, an inverter train that causes a signal delay equivalent to a critical path (signal path having the longest number of logic gate stages) in the internal circuit 33 is provided in the power voltage evaluation circuit 32 as a delay evaluation circuit, and a control signal is outputted based on a delay amount detected by the delay evaluation circuit. For example, if the delay amount is smaller than a lower-limit set value, which implies a higher operating speed of the internal circuit, then a control signal that causes the power voltage to be decreased is outputted. On the other hand, if the delay amount is larger than an upper-limit set value, which implies a lower operating speed of the internal circuit, then a control signal that causes the power voltage to increase is outputted. Also, if the delay amount is not less than the lower-limit set value and not more than the upper-limit set value, which implies a proper operating speed of the internal circuit, then a control signal that makes the power voltage held is outputted. In this way, a operating state of the delay evaluation circuit is detected, and the power voltage generated from the power voltage generation circuit 31 is controlled so as to give the internal circuit 33 a power voltage that is a minimum required for its operation.

In another case, there has been proposed a technique for extremely lowering the power voltage in order to reduce the power consumption of a semiconductor integrated circuit device to a large extent. In a semiconductor integrated circuit device, since power consumption of the integrated circuit due to switching is proportional to the square of the power voltage, it is effective to lower the power voltage in terms of power consumption reduction, but there is a problem that lowering the power voltage alone would cause the ON-state current of a MOS transistor to decrease, inhibiting the high-speed operation. To avoid this problem, the absolute value of the threshold voltage of the MOS transistor needs to be decreased in accordance with the decrease of the power voltage. However, decreasing the absolute value of the threshold voltage would give rise to another problem that the OFF-state current by a subthreshold current of the MOS transistor to increase.

As a MOS transistor circuit for relieving such an OFF-state current increase issue, there has been proposed a method in which a semiconductor substrate (or well) with a MOS transistor formed thereon is connected to the gate terminal and the threshold voltage of the MOS transistor is controlled by the voltage of the gate terminal, as disclosed in JP 08-12917 A. That is, as shown in FIG. 4, in the state that the semiconductor substrate (or well) with an N-type MOS transistor 41 formed thereon and the gate terminal of the N-type MOS transistor 41 are connected to each other, when a voltage that causes the N-type MOS transistor 41 to turn on (i.e., a positive voltage relative to a source voltage Vs) is applied to the gate terminal as a gate voltage Vg, the same voltage is applied also to the semiconductor substrate (or well) and therefore the threshold voltage decreases in absolute value equivalently, causing the ON-state current to increase. On the other hand, when a voltage that causes the N-type MOS transistor 41 to turn off (i.e., an equal or negative voltage relative to the source voltage Vs) is applied to the gate terminal as a gate voltage Vg, the same voltage is applied also to the semiconductor substrate (or well) and therefore the threshold voltage increases in absolute value equivalently, causing the OFF-state current to decrease.

For example, in the above MOS transistor circuit, the relationship between gate voltage Vgs and drain current Ids of the N-type MOS transistor 41 can be set as shown in FIG. 5, where the ON-state current can be made as large as $10^{-4}$ A/$\mu$m, comparable to that of common MOS transistors of low threshold voltage, while the OFF-state current can be made as small as $10^{-10}$ A/$\mu$m, comparable to that of common MOS transistors of high threshold voltage.

Although an N-type MOS transistor has been shown in FIG. 4, the case is the same also with a P-type MOS transistor. That is, when a voltage that causes a P-type MOS transistor to turn on (i.e., a negative voltage relative to a source voltage Vs) is applied to the gate terminal as a gate voltage Vg, the same voltage is applied also to the semiconductor substrate (or well) with the P-type MOS transistor formed thereon and therefore the threshold voltage decreases in absolute value equivalently, causing the ON-state current to increase. On the other hand, when a voltage that causes the P-type MOS transistor to turn off (i.e., an equal or positive voltage relative to the source voltage Vs) is applied to the gate terminal as a gate voltage Vg, the same voltage is applied also to the semiconductor substrate (or well) and therefore the threshold voltage increases in absolute value equivalently, causing the OFF-state current to decrease.

FIG. 6 shows a CMOS (Complementary Metal-Oxide Semiconductor) inverter circuit formed by using the MOS transistors connecting such a semiconductor substrate (or well) to the gate terminal.

Hereinbelow, for simplicity of explanation, it is assumed that both a P-type MOS transistor 61 and an N-type MOS transistor 62 have characteristics shown in FIG. 5. A semiconductor substrate (or well) with the P-type MOS transistor 61 and the N-type MOS transistor 62 formed thereon is connected a gate terminal of the P-type MOS transistor 61 and the N-type MOS transistor 62 (i.e., to an input terminal 63 of a CMOS inverter circuit, and voltages Vsubp, Vsubn of the semiconductor substrate (or well) are equal to a voltage Vin of the input terminal 63.

Accordingly, in the case where the voltage Vin of the input terminal 63 is equal to a ground voltage Gnd, a turn-ON voltage is applied to the gate terminal of the P-type MOS transistor 61, so that the threshold voltage decreases in absolute value equivalently, causing the ON-state current to increase to as large as $10^{-4}$ A/$\mu$m (current value for each 1 $\mu$m of channel width). Simultaneously with this, a turn-OFF voltage is applied to the gate terminal of the N-type MOS transistor 62, so that the threshold voltage increases in absolute value equivalently, causing the OFF-state current to decrease to as small as $10^{-10}$ A/$\mu$m. On the other hand, in the case where the voltage Vin of the input terminal 63 is equal to the power voltage Vdd, a turn-OFF voltage is applied to the P-type MOS transistor 61, so that the threshold voltage increases in absolute value equivalently, causing the OFF-state current to decrease to as small as $10^{-10}$ A/$\mu$m. Simultaneously with this, a turn-ON voltage is applied to the N-type MOS transistor 62, so that the threshold voltage decreases in absolute value equivalently, causing the ON-state current to increase to as large as $10^{-4}$ A/$\mu$m.

As shown above, the ON-state current for the P-type MOS transistor 61 and the N-type MOS transistor 62 to be turned ON becomes $10^{-4}$ A/$\mu$m, causing the drive current for the CMOS inverter circuit to be as large as $10^{-4}$ A/$\mu$m, while the OFF-state current for the P-type MOS transistor 61 and the N-type MOS transistor 62 to be turned OFF becomes $10^{-10}$ A/$\mu$m so that a leak current flowing from the power voltage terminal to the ground voltage terminal becomes as small as $10^{-10}$ A/$\mu$m.

From now onward, as the further micro-fining of integrated circuits as well as the reduction of power voltage advance on and on, the effects of variations in manufacturing processes or such variations as power supply variations and temperature changes on the processing speed would become larger, and moreover in OFF-state current increase issue due to decrease of threshold voltage would matter. Therefore, a power voltage control technique such as shown in FIG. 3 as well as a MOS transistor circuit in which a semiconductor substrate (or well) such as shown in FIG. 6 is connected to the gate terminal are effective.

However, when the power voltage control technique of the semiconductor integrated circuit device shown in FIG. 3 and the MOS transistor circuit shown in FIG. 6 are combined together, there are issues as follows.

With the use of the power voltage control technique, there is a case where the power voltage increases beyond the built-in potential (diffusion potential) in response to variations in manufacturing processes or such variations as power supply variations and temperature changes. Since the semiconductor substrate (or well) on which MOS transistors composing the MOS transistor circuit are formed are connected to the gate terminal, the power voltage that has become over the built-in potential would cause the a voltage over the built-in potential to be applied to between the semiconductor substrate (or well) and the source terminal. As a result, a current would flow between the semiconductor substrate (or well) and the source terminal (i.e., between the gate terminal and the source terminal), so that the gate current would increase considerably, posing problems such as unstable operation of the MOS transistor circuit or increased current consumption thereof.

DISCLOSURE OF INVENTION

Accordingly, the present invention provides a semiconductor integrated circuit device, as well as a portable terminal using the device, which is capable of suppressing the increase of the gate current and thereby preventing unstable operations of the MOS transistor circuit and the increase of the current consumption even in the case where the power voltage control technique for adjusting the power voltage so that the power voltage becomes as low as possible within a range over which the internal circuit normally operates, and the MOS transistor circuit in which the semiconductor substrate (or well) is connected to the gate terminal, are connected together.

In order to achieve the above, according to the present invention, there is provided a semiconductor integrated circuit device having a power voltage generation circuit for generating a power voltage, and an internal circuit to which the power voltage is fed from the power voltage generation circuit and which performs specified processing, the semiconductor integrated circuit device further comprising:

a first power voltage control circuit which outputs a first control signal for controlling the power voltage of the power voltage generation circuit so that the power voltage generated by the power voltage generation circuit becomes lower within a range over which the internal circuit normally operates; and a second power voltage control circuit which outputs a second control signal for controlling the power voltage of the power voltage generation circuit so that the power voltage generated by the power voltage generation circuit does not become equal to or higher than a specified voltage.

In this semiconductor integrated circuit device, the power voltage of the power voltage generation circuit is controlled by the first control signal outputted from the first power voltage control circuit so that the power voltage becomes lower within the range over which the internal circuit normally operates, and moreover the power voltage of the power voltage generation circuit is controlled by the second control signal outputted from the second power voltage control circuit so that the power voltage generated by the power voltage generation circuit does not become equal to or higher than a specified voltage. Therefore, in addition to the control of the power voltage by the first power voltage control circuit, control of the power voltage is exerted also by the second power voltage control circuit, so that excessive increase of the power voltage is suppressed by the power-voltage control by the first power voltage control circuit and, as a result, unstable circuit operations and considerable increase of the current consumption can be prevented.

Also, in one embodiment, there is provided the semiconductor integrated circuit, wherein the first power voltage control circuit comprises:

a delay evaluation circuit for evaluating a delay amount of the internal circuit; and a first control signal output circuit which, based on an evaluation result of the delay evaluation circuit outputs the first control signal for controlling the power voltage of the power voltage generation circuit so that the power voltage generated by the power voltage generation circuit is raised when the delay amount of the internal circuit becomes larger than an upper-limit value, and the power voltage generated by the power voltage generation circuit is lowered when the delay amount of the internal circuit becomes smaller than a lower-limit value.

In the semiconductor integrated circuit device of this embodiment, the delay amount of the internal circuit is evaluated by the delay evaluation circuit of the first power voltage control circuit and, based on a result of the evaluation, the first control signal output circuit of the first power voltage control circuit outputs a first control signal for controlling the power voltage of the power voltage generation circuit so that the power voltage generated by the power voltage generation circuit is raised when the delay amount of the internal circuit becomes larger than the upper-limit value. Also, the first control signal output circuit of the first power voltage control circuit outputs the first control signal for controlling the power voltage of the power voltage generation circuit so that the power voltage generated by the power voltage generation circuit is lowered when the delay amount of the internal circuit becomes lower than the lower-limit value. Therefore, the power voltage can be adjusted so as to become as low as possible within such a range that the processing time of the internal circuit falls just within the one cycle time of the clock even if the processing time has changed due to variations in manufacturing processes or such variations as power supply variations and temperature changes.

Also, in one embodiment, there is provided the semiconductor integrated circuit device, wherein the second power voltage control circuit comprises:

a decision circuit for deciding whether or not the power voltage generated by the power voltage generation circuit is equal to or higher than a specified voltage; and a second control signal output circuit which outputs the second control signal for controlling the power voltage of the power voltage generation circuit so that the power voltage generated by the power voltage generation circuit does not become equal to or higher than the specified voltage when the decision circuit has decided that the power voltage generated by the power voltage generation circuit is equal to or higher than the specified voltage.

In the semiconductor integrated circuit device of this embodiment, the power voltage of the power voltage generation circuit is controlled by the second control signal of the second control signal output circuit so that power voltage generated by the power voltage generation circuit does not become equal to or higher than the specified voltage, when the decision circuit of the second power voltage control circuit has decided that the power voltage is not less than the specified voltage. Therefore, increase of the power voltage of the power voltage generation circuit over the specified voltage can be suppressed and, as a result, unstable circuit operations and considerable increase of the current consumption can be prevented.

Also, in one embodiment, there is provided the semiconductor integrated circuit device, wherein the power voltage generation circuit prefers the second control signal to the first control signal, and the power voltage of the power voltage generation circuit is controlled by the preferred second control signal.

In the semiconductor integrated circuit device of this embodiment, suppressing increase of the power voltage over the specified voltage is done in preference to adjusting the power voltage so that the power voltage becomes as low as possible within such a range that the processing time falls just within the one cycle time of the clock even if the processing time has changed due to variations in manufacturing processes or such variations as power supply variations and temperature changes. Therefore, the power voltage can be prevented from increasing more than necessary for the suppression of the processing time that would cause unstable circuit operations and considerable increase of the current consumption.

Also, in one embodiment, there is provided the semiconductor integrated circuit device, wherein the internal circuit comprises a MOS transistor, and a semiconductor substrate or well on which the MOS transistor of the internal circuit is formed is electrically connected to a gate terminal of the MOS transistor.

In the semiconductor integrated circuit device of this embodiment, even if the threshold voltage of the MOS transistor is made smaller as the power voltage of the power voltage generation circuit decreases, increase of the OFF-state current of the MOS transistor of which the internal circuit is constituted can be suppressed.

Also, in one embodiment, there is provided the semiconductor integrated circuit device, wherein a specified voltage detected by the second power voltage control circuit is a voltage corresponding to a built-in potential.

In the semiconductor integrated circuit device of this embodiment, increase of the power voltage of the power voltage generation circuit over the built-in potential can be suppressed by the second power voltage control circuit in the MOS transistor circuit in which the semiconductor substrate (or well) is connected to its gate terminal. Therefore, the power voltage can be prevented from increasing over the built-in potential, which would otherwise lead to unstable circuit operations or considerable increase of the current consumption.

Also, in one embodiment, there is provided the semiconductor integrated circuit device, wherein the second power voltage control circuit comprises:

a diode and a resistor connected in series between a terminal to which the power voltage is fed and a terminal to which a ground voltage is fed, and an amplification circuit for amplifying a voltage across the resistor.

In the semiconductor integrated circuit device of this embodiment, the second power voltage control circuit can be constructed with a small-scale circuit by using the diode, the resistor and the amplification circuit.

Also, in one embodiment, there is provided the semiconductor integrated circuit device, wherein the diode of the second power voltage control circuit comprises a MOS transistor, and a semiconductor substrate or well on which the MOS transistor is formed is electrically connected to a gate terminal of the MOS transistor, and a source terminal of the MOS transistor is electrically connected to its drain terminal.

In the semiconductor integrated circuit device of this embodiment, when a voltage equal to or higher than the built-in potential is applied to the MOS transistor that forms the diode of the second power voltage control circuit, the current flowing between the semiconductor substrate (or well) of the MOS transistor to the gate terminal of which the semiconductor substrate (or well) is connected, and its source terminal (i.e., between the gate terminal and the source terminal) increases. This makes it easily detectable that the power voltage is not less than the built-in potential.

Also, in one embodiment, there is provided the semiconductor integrated circuit device, wherein the diode of the second power voltage control circuit comprises a P-type MOS transistor and an N-type MOS transistor, a source terminal and a drain terminal of the P-type MOS transistor, a semiconductor substrate or well on which the N-type MOS transistor is formed, and a gate terminal of the N-type MOS transistor are electrically connected to one another, and a source terminal and a drain terminal of the N-type MOS transistor, a semiconductor substrate or well on which the P-type MOS transistor is formed, and a gate terminal of the P-type MOS transistor are electrically connected to one another.

In the semiconductor integrated circuit device of this embodiment, current increases in both the P-type MOS transistor and the N-type MOS transistor can be detected, so that the circuit operation can be stabilized even when the current increase of one of the MOS transistors is large.

Also, in one embodiment, there is provided the semiconductor integrated circuit device, wherein the resistor of the second power voltage control circuit comprises a MOS transistor in which a voltage is applied to between its source terminal and drain terminal.

In the semiconductor integrated circuit device of this embodiment, since the voltage is applied to between the source terminal and the drain terminal of the MOS transistor that forms the resistor of the second power voltage control circuit, any change in detected voltage of the second power voltage control circuit can be suppressed even if the threshold voltage of the MOS transistor has changed due to a temperature change.

Also, in one embodiment, there is provided the semiconductor integrated circuit device, wherein the resistor of the second power voltage control circuit comprises a non-silicified polysilicon.

In the semiconductor integrated circuit device of this embodiment, since the resistor of the second power voltage control circuit is formed of a non-silicified polysilicon, a resistor having a large resistance value can be easily formed, by which the diode forming the second power voltage control circuit can be reduced in size.

Also, in one embodiment, there is provided the semiconductor integrated circuit device, wherein the second control signal output circuit of the second power voltage control circuit has a P-type MOS transistor and an N-type MOS transistor complementarily connected between a terminal to which the power voltage is fed and a terminal to which the ground voltage is fed, a semiconductor substrate or well on which the P-type MOS transistor is formed is connected to the terminal to which the power voltage is fed, and a semiconductor substrate or well on which the N-type MOS transistor is formed is connected to a gate terminal of the N-type MOS transistor.

In the semiconductor integrated circuit device of this embodiment, the input voltage for inverting the output voltage of the amplification circuit can be lowered, and the voltage can be amplified by the amplification circuit even if the voltage across the resistor of the second power voltage control circuit is small.

Furthermore, according to the present invention, there is provided a portable terminal including as a constituent component the semiconductor integrated circuit device as defined above.

In this portable terminal, its power consumption can be reduced and its battery life can be prolonged because the portable terminal includes as a constituent component thereof a semiconductor integrated circuit in which increase of the gate current is suppressed and in which the MOS transistor circuit is free from unstable circuit operations and considerable increase of the current consumption even in the case where the power voltage control technique and the MOS transistor circuit to the gate terminal of which a semiconductor substrate (or well) is connected are combined together.

BEST MODE FOR CARRYING OUT THE INVENTION

Hereinbelow, the semiconductor integrated circuit device of the present invention as well as the portable terminal using the device are described in detail by way of embodiments thereof illustrated in the accompanying drawings.

Figure 1:
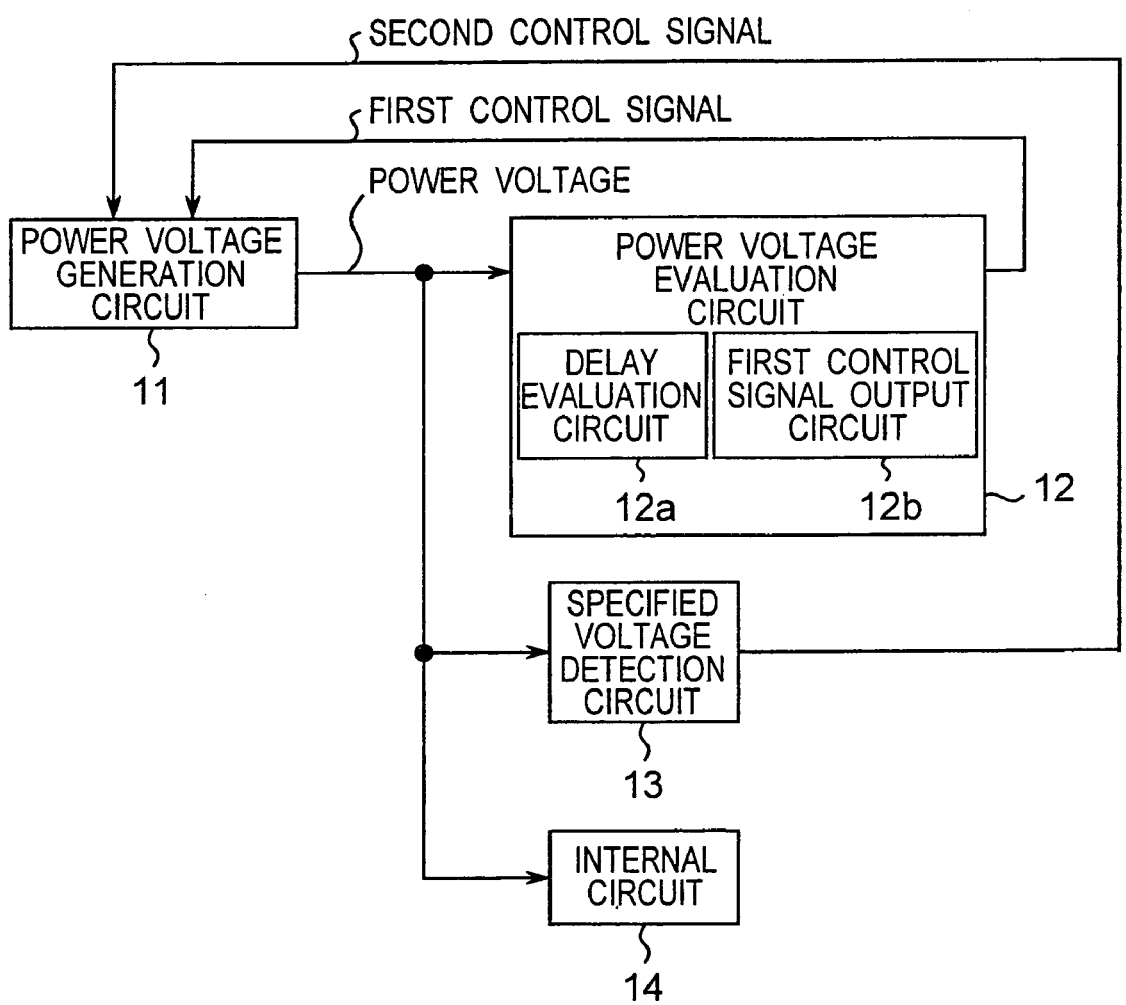
FIG. 1 is a constructional view of a semiconductor integrated circuit device according to an embodiment of the present invention.

FIG. 1 is a block diagram showing the construction of a semiconductor integrated circuit device according to an embodiment of the present invention.

This semiconductor integrated circuit device, as shown in FIG. 1, has a power voltage generation circuit 11 for generating a power voltage, a power voltage evaluation circuit 12 as a first power voltage control circuit for receiving as an input a power voltage derived from the power voltage generation circuit 11 and producing as an output a first control signal to the power voltage generation circuit 11, a specified voltage detection circuit 13 as a second power voltage control circuit for receiving as an input a power voltage derived from the power voltage generation circuit 11 and producing as an output a second control signal to the power voltage generation circuit 11, and an internal circuit 14 which is fed with the power voltage from the power voltage generation circuit 11 and which performs specified processing.

In the semiconductor integrated circuit device of this construction, the first control signal outputted from the power voltage evaluation circuit 12 adjusts the power voltage so that the power voltage becomes as low as possible within a range over which the internal circuit 14 normally operates. More specifically, an inverter train that provides a delay amount equivalent to a critical path in the internal circuit 14 is provided in the power voltage evaluation circuit 12 as a delay evaluation circuit 12a. A delay amount is detected by the delay evaluation circuit 12a, and a first control signal is outputted from a first control signal output circuit 12b based on a delay amount detected by the delay evaluation circuit. For example, if a delay amount detected by the delay evaluation circuit 12a is smaller than a lower-limit set value, which implies a higher operating speed of the internal circuit 14, then a first control signal that causes the power voltage to be decreased is outputted. If the delay amount detected by the delay evaluation circuit 12a is larger than an upper-limit set value, which implies a lower operating speed of the internal circuit 14, then a first control signal that causes the power voltage to increase is outputted. Also, if the delay amount by the delay evaluation circuit 12a is not less than the lower-limit set value and not more than the upper-limit set value, which implies a proper operating speed of the internal circuit 14, then a first control signal that makes the power voltage held is outputted. In this way, the power voltage of the power voltage generation circuit 11 is controlled so as to give a power voltage that is a minimum required for the operation of the internal circuit 14 in correspondence to the operating state of the delay evaluation circuit 12a.

On the other hand, a second control signal outputted from the specified voltage detection circuit 13 adjusts the power voltage so that the power voltage does not increase beyond a specified voltage. More specifically, a second control signal is outputted so that the power voltage becomes equals to the ground voltage when smaller than the specified voltage, and becomes equal to the power voltage when not less than the specified voltage.

By the second control signal exerting the control of the power voltage in preference to the first control signal, excessive increase of the power voltage can be suppressed by the control of the power voltage control exerted by the power voltage evaluation circuit 12. Therefore, even if the internal circuit 14 is constituted of a MOS transistor in which a semiconductor substrate (or well) is connected to the gate terminal, unstable circuit operations and considerable increase of the current consumption can be prevented.

Figure 2:
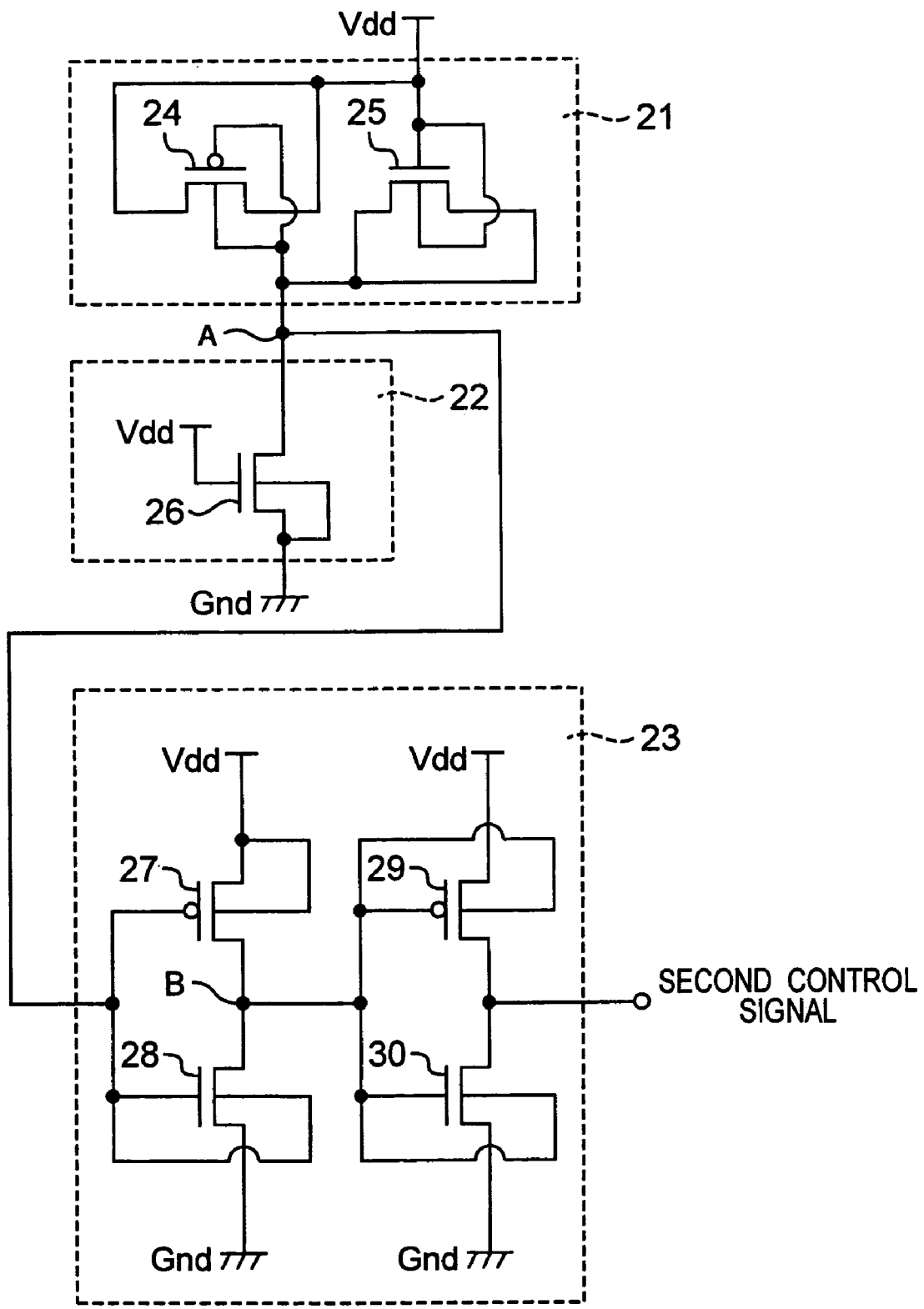
FIG. 2 is a circuit diagram of a specified voltage detection circuit of the semiconductor integrated circuit device.
Figure 3:
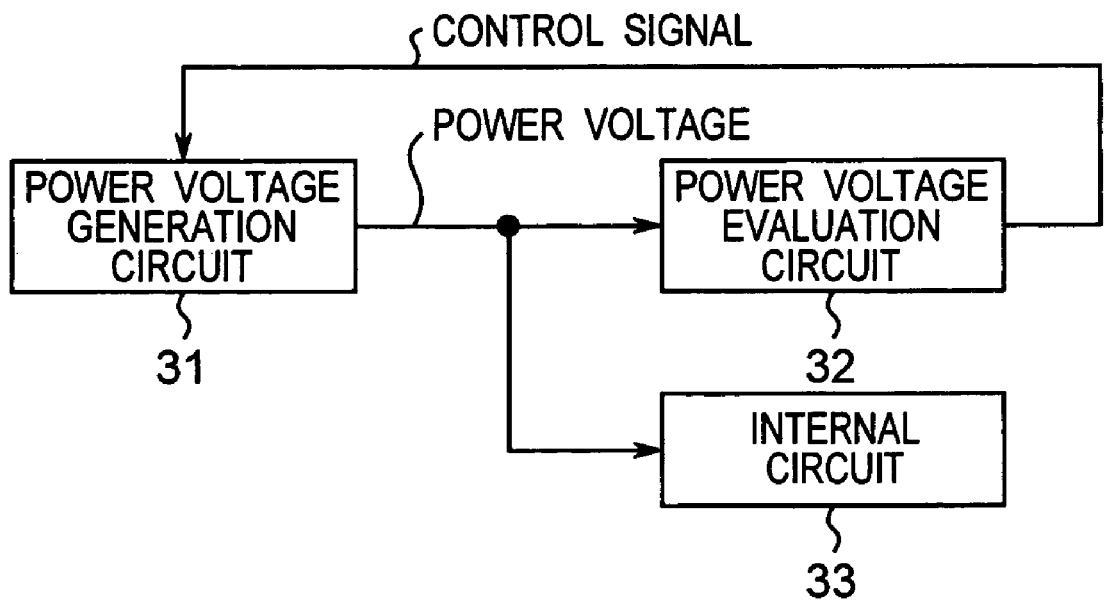
FIG. 3 is a constructional view of a semiconductor integrated circuit device according to a conventional semiconductor integrated circuit device.
Figure 4:
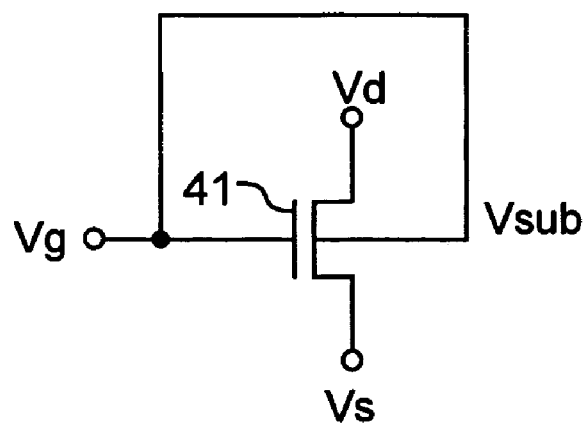
FIG. 4 is a circuit diagram of a conventional N-type MOS transistor circuit for reducing the OFF-state current.
Figure 5:
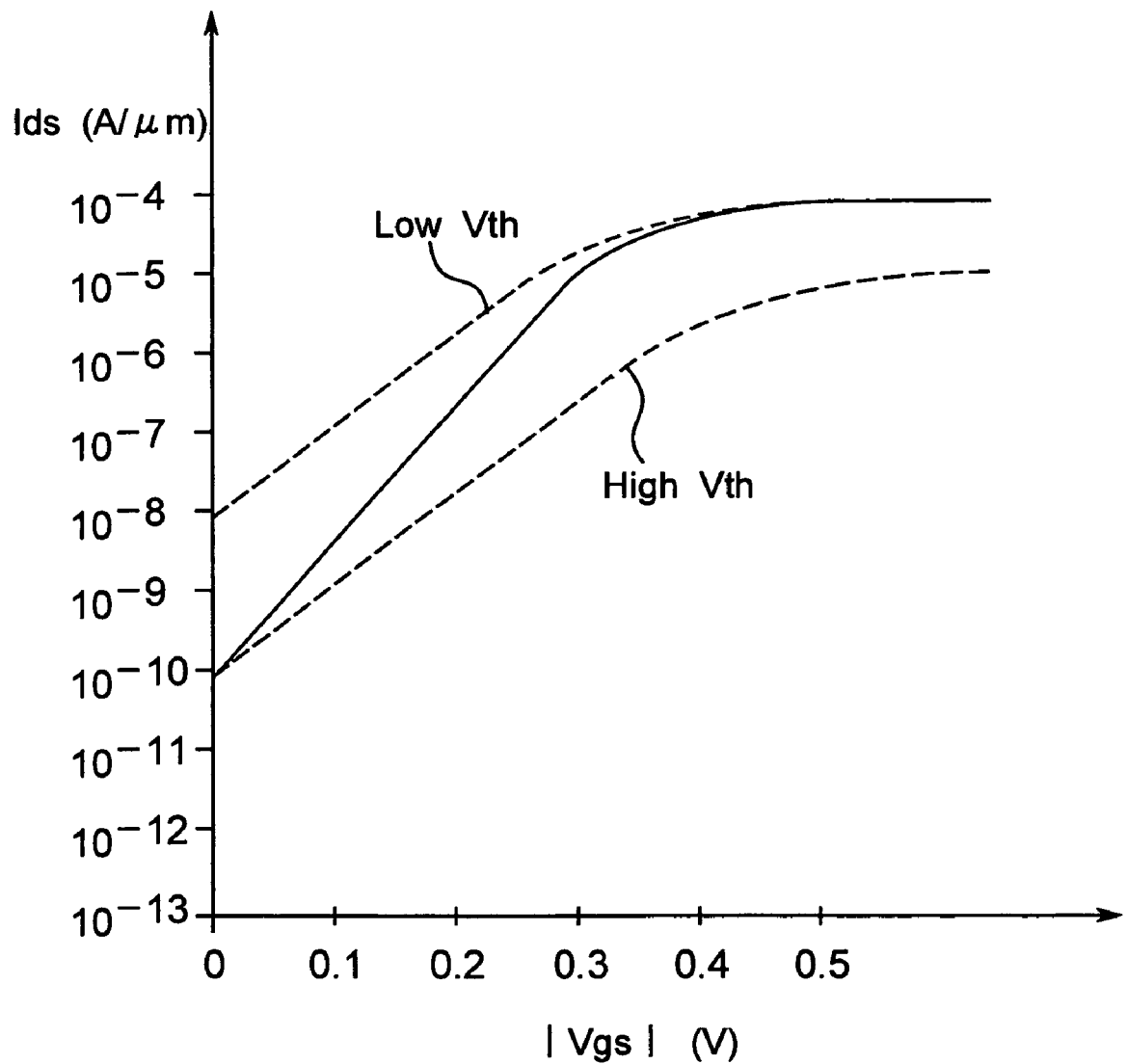
FIG. 5 is a view showing a relationship between gate current and drain current of the N-type MOS transistor circuit.
Figure 6:
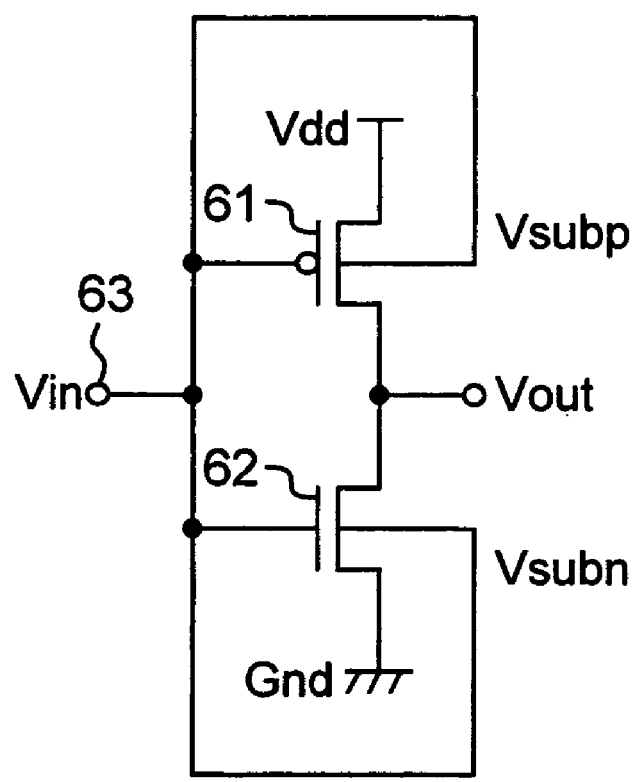
FIG. 6 is a circuit diagram of a CMOS inverter circuit constructed by using the MOS transistor circuit.

FIG. 2 is a circuit diagram of a specified voltage detection circuit of the semiconductor integrated circuit device. As shown in FIG. 2, the specified voltage detection circuit 13 is composed of a first or diode circuit 21 operating as a diode and a second or resistor circuit 22 operating as a resistor connected in series between a terminal to which the power voltage Vdd is fed and a terminal to which the ground voltage Gnd is fed, and an amplification circuit 23 for amplifying a voltage at a connecting point A between the diode circuit 21 and the resistor circuit 22. The diode circuit 21 and the resistor circuit 22 constitute a decision circuit, and the amplification circuit 23 implements a second control signal output circuit.

With this constitution, a current corresponding to the power voltage Vdd flows to the series-connected diode circuit 21 and resistor circuit 22, and a voltage corresponding to the magnitude of the current appears to the connecting point A of the diode circuit 21 and the resistor circuit 22. This voltage, which is small, is amplified by the amplification circuit 23 and a second control signal is outputted. Electrical characteristics of the diode circuit 21, the resistor circuit 22 and the amplification circuit 23 are so set that the second control signal becomes equal to the ground voltage on condition that the power voltage Vdd is smaller than the specified voltage, and the second control signal becomes equal to the power voltage on condition that the power voltage Vdd is not less than the specified voltage. In this way, the specified voltage detection circuit 13 can be implemented by a small-scale circuit.

Further, the diode circuit 21 is composed of a P-type MOS transistor 24 and an N-type MOS transistor 25. A source terminal and a drain terminal of the P-type MOS transistor 24, a semiconductor substrate (or well) with the N-type MOS transistor 25 formed thereon, and a gate terminal of the N-type MOS transistor 25 are electrically connected to one another, and a source terminal and a drain terminal of the N-type MOS transistor 25, a semiconductor substrate (or well) with the P-type MOS transistor 24 formed thereon, and gate terminal of the P-type MOS transistor 24 are electrically connected to one another. That is, the P-type MOS transistor 24 and the N-type MOS transistor 25 are each equivalent to a diode, meaning that two diodes are connected in parallel.

In the case where the diode circuit 21 is made up of the P-type MOS transistor 24 and the N-type MOS transistor 25 as shown above, the current flowing through the diode circuit 21 abruptly increases when a voltage higher than the built-in potential is applied thereto. This makes it easily detectable that the current flowing between the semiconductor substrate (or well) and the source terminal (i.e., between the gate terminal and the source terminal) of the MOS transistor to the gate terminal of which the semiconductor substrate (or well) is connected increases. Further, current increases in both the P-type MOS transistor 24 and the N-type MOS transistor 25 can be detected, so that the circuit operation can be stabilized even when the current increase of one of the MOS transistors is large.

Also, the resistor circuit 22 is implemented by an N-type MOS transistor 26, is so connected that a voltage is applied to between the source terminal and the drain terminal of the MOS transistor 26. In the resistor circuit 22, as the threshold voltage of the N-type MOS transistor 26 as a resistor with changing temperature increases, the resistance value of the N-type MOS transistor 26 increases so that the voltage of the connecting point A between the diode circuit 21 and the resistor circuit 22 (i.e., the voltage across the resistor circuit 22) increases. On the other hand, the amplification circuit 23 as well normally includes an N-type MOS transistor having the same threshold voltage, so that the voltage of the connecting point A between the diode circuit 21 and the resistor circuit 22 also increases in the case where the second control signal is such that the voltage becomes equal to the power voltage. Accordingly, even if the threshold voltage of the N-type MOS transistor has changed with changing temperature, any change in detected voltage of the specified voltage detection circuit 13 can be suppressed.

Although the resistor circuit 22 is implemented by an N-type MOS transistor and placed on the lower voltage side relative to the diode circuit 21 in this embodiment, it is also possible that the resistor circuit 22 is implemented by a P-type MOS transistor and placed on the higher voltage side relative to the diode circuit 21.

Desirably, the resistor circuit 22 is formed of a non-silicified polysilicon. This non-silicified polysilicon, having a sheet resistance as high as about 100 $\Omega/\square$ (ohms per square) makes it possible to form a resistor having a resistance as large as $10^6$ $\Omega$ by forming a interconnect line having a width of 1 $\mu$m and a length of 10 mm. Accordingly, in the case where the resistor circuit 22 is implemented by a non-silicified polysilicon, the voltage of the connecting point A between the diode circuit 21 and the resistor circuit 22 can be made as sufficiently large as about 0.2 V, which causes the output of the amplification circuit 23 to change, even if the current flowing through the diode circuit 21 is as small as 0.2 $\mu$A. Therefore, the diode circuit 21 can be downsized.

Also, the amplification circuit 23 has a P-type MOS transistor 27 and an N-type MOS transistor 28 complementarily connected between a terminal to which the power voltage Vdd is fed and a terminal to which the ground voltage Gnd is fed, a semiconductor substrate (or well) with the P-type MOS transistor 27 formed thereon is connected to the terminal to which the power voltage Vdd is fed, and a semiconductor substrate (or well) with the N-type MOS transistor 28 formed thereon is connected to a gate terminal of the N-type MOS transistor 28. The voltage of a connecting point B between the P-type MOS transistor 27 and the N-type MOS transistor 28 is inverted by a P-type MOS transistor 29 and an N-type MOS transistor 30 complementarily connected between a terminal to which the power voltage Vdd is fed and a terminal to which the ground voltage Gnd is fed, by which a second control signal is outputted. A semiconductor substrate (or well) with the P-type MOS transistor 29 formed thereon is connected to a gate terminal of the P-type MOS transistor 29, and a semiconductor substrate (or well) with the N-type MOS transistor 30 formed thereon is connected to a gate terminal of the N-type MOS transistor 30.

In this amplification circuit 23, since the semiconductor substrate (or well) with the P-type MOS transistor 27 formed thereon is connected to the terminal to which the power voltage Vdd is fed and the semiconductor substrate (or well) with the N-type MOS transistor 28 formed thereon is connected to the gate terminal of the N-type MOS transistor 28, the current driving force of the N-type MOS transistor 28 can be enhanced over the current driving force of the P-type MOS transistor 27. By doing so, the input voltage for inverting the output voltage of the amplification circuit 23 can be made lower, and the amplification can be implemented by the amplification circuit 23 even if the voltage of the connecting point A between the diode circuit 21 and the resistor circuit 22 is small.

When the semiconductor integrated circuit device of FIG. 1 is used as a constituent component of a portable terminal such as portable phones or portable information terminals, the power consumption can be reduced and the battery life can be prolonged.

What is claimed is:

1. A semiconductor integrated circuit device having a power voltage generation circuit for generating a power voltage, and an internal circuit having an operating speed to which the power voltage is fed from the power voltage generation circuit and which performs specified processing, the semiconductor integrated circuit device further comprising:

a first power voltage control circuit which outputs a first control signal for controlling the power voltage of the power voltage generation circuit to maintain the operating speed of the internal circuit within a range, the first power control circuit comprising:

a delay evaluation circuit for evaluating a delay amount of the internal circuit; and a first control signal output circuit which, based on an evaluation result of the delay evaluation circuit outputs the first control signal for controlling the power voltage of the power voltage generation circuit so that the power voltage generated by the power voltage generation circuit is raised when the delay amount of the internal circuit becomes larger than an upper-limit value, and the power voltage generated by the power voltage generation circuit is lowered when the delay amount of the internal circuit becomes smaller than a lower-limit value; and a second power voltage control circuit which outputs a second control signal for controlling the power voltage of the power voltage generation circuit so that the power voltage generated by the power voltage generation circuit does not become equal to or higher than a specified voltage.

2. The semiconductor integrated circuit device according to claim 1, wherein the second power voltage control circuit comprises:

a decision circuit for deciding whether or not the power voltage generated by the power voltage generation circuit is equal to or higher than a specified voltage; and a second control signal output circuit which outputs the second control signal for controlling the power voltage of the power voltage generation circuit so that the power voltage generated by the power voltage generation circuit does not become equal to or higher than the specified voltage when the decision circuit has decided that the power voltage generated by the power voltage generation circuit is equal to or higher than the specified voltage.

3. The semiconductor integrated circuit device according to claim 2, wherein the power voltage generation circuit gives priority to the second control signal the first control signal, and the power voltage of the power voltage generation circuit is controlled by the second control signal.

4. The semiconductor integrated circuit device according to claim 1, wherein the internal circuit comprises a MOS transistor, and a semiconductor substrate or well on which the MOS transistor of the internal circuit is formed is electrically connected to a gate terminal of the MOS transistor.

5. The semiconductor integrated circuit device according to claim 4, wherein a specified voltage detected by the second power voltage control circuit is a voltage corresponding to a built-in potential.

6. The semiconductor integrated circuit device according to claim 1, wherein
the second power voltage control circuit comprises:
a diode circuit and a resistor circuit connected in series between a terminal to which the power voltage is fed and a terminal to which a ground voltage is fed, and an amplification circuit for amplifying a voltage across the resistor circuit.

7. The semiconductor integrated circuit device according to claim 6, wherein
the diode circuit of the second power voltage control circuit comprises a MOS transistor, and
a semiconductor substrate or well on which the MOS transistor is formed is electrically connected to a gate terminal of the MOS transistor, and
a source terminal of the MOS transistor is electrically connected to its drain terminal.

8. The semiconductor integrated circuit device according to claim 6, wherein
the diode circuit of the second power voltage control circuit comprises a P-type MOS transistor and an N-type MOS transistor,
a source terminal and a drain terminal of the P-type MOS transistor, a semiconductor substrate or well on which the N-type MOS transistor is formed, and a gate terminal of the N-type MOS transistor are electrically connected to one another, and
a source terminal and a drain terminal of the N-type MOS transistor, a semiconductor substrate or well on which the P-type MOS transistor is formed, and a gate terminal of the P-type MOS transistor are electrically connected to one another.

9. The semiconductor integrated circuit device according to claim 6, wherein
the resistor circuit of the second power voltage control circuit comprises a MOS transistor in which a voltage is applied to between its source terminal and drain terminal.

10. The semiconductor integrated circuit device according to claim 6, wherein
the resistor circuit of the second power voltage control circuit comprises a non-silicified polysilicon.

11. The semiconductor integrated circuit device according to claim 6, wherein
the second control signal output circuit of the second power voltage control circuit has a P-type MOS transistor and an N-type MOS transistor complementarily connected between a terminal to which the power voltage is fed and a terminal to which the ground voltage is fed,
a semiconductor substrate or well on which the P-type MOS transistor is formed is connected to the terminal to which the power voltage is fed, and
a semiconductor substrate or well on which the N-type MOS transistor is formed is connected to a gate terminal of the N-type MOS transistor.

12. A portable terminal including as a constituent component the semiconductor integrated circuit device having a power voltage generation circuit for generating a power voltage, and an internal circuit having an operating speed to which the power voltage is fed from the power voltage generation circuit and which performs specified processing, the semiconductor integrated circuit device further comprising:
a first power voltage control circuit which outputs a first control signal for controlling the power voltage of the power voltage generation circuit to maintain the operating speed of the internal circuit within a range over which the internal circuit normally operates, the first power control circuit comprising:
a delay evaluation circuit for evaluating a delay amount of the internal circuit; and
a first control signal output circuit which, based on an evaluation result of the delay evaluation circuit outputs the first control signal for controlling the power voltage of the power voltage generation circuit so that the power voltage generated by the power voltage generation circuit is raised when the delay amount of the internal circuit becomes larger than an upper-limit value, and the power voltage generated by the power voltage generation circuit is lowered when the delay amount of the internal circuit becomes smaller than a lower-limit value; and
a second power voltage control circuit which outputs a second control signal for controlling the power voltage of the power voltage generation circuit so that the power voltage generated by the power voltage generation circuit does not become equal to or higher than a specified voltage.

* * * * *